(12) United States Patent
Han et al.

(10) Patent No.: US 9,583,447 B2
(45) Date of Patent: Feb. 28, 2017

(54) EMI SHIELDING METHOD OF SEMICONDUCTOR PACKAGES

(71) Applicant: Genesem Inc., Incheon (KR)

(72) Inventors: Bok-Woo Han, Incheon (KR); Hee-Dong Lee, Incheon (KR)

(73) Assignee: GENESEM INC., Incheon (KR)

( * ) Notice: Subject to any disclaimer, the term of this patent is extended or adjusted under 35 U.S.C. 154(b) by 0 days.

(21) Appl. No.: 14/915,321

(22) PCT Filed: Apr. 15, 2015

(86) PCT No.: PCT/KR2015/003750
§ 371 (c)(1),
(2) Date: Feb. 29, 2016

(87) PCT Pub. No.: WO2016/047880
PCT Pub. Date: Mar. 31, 2016

(65) Prior Publication Data
US 2016/0293553 A1    Oct. 6, 2016

(30) Foreign Application Priority Data
Sep. 23, 2014    (KR) .................. 10-2014-0127067

(51) Int. Cl.
| | | |
|---|---|---|
| *H01L 21/00* | (2006.01) | |
| *H01L 23/552* | (2006.01) | |
| *H01L 23/60* | (2006.01) | |
| *H01L 21/56* | (2006.01) | |
| *H01L 23/28* | (2006.01) | |

(52) U.S. Cl.
CPC ............ *H01L 23/552* (2013.01); *H01L 21/56* (2013.01); *H01L 23/28* (2013.01); *H01L 23/60* (2013.01); *H01L 2924/0002* (2013.01)

(58) Field of Classification Search
CPC ....................................................... H01L 21/00
See application file for complete search history.

(56) References Cited

FOREIGN PATENT DOCUMENTS

| | | |
|---|---|---|
| JP | 2001-160605 | 6/2001 |
| KR | 10-0136615 | 9/1998 |
| KR | 10-2011-0021655 | 3/2011 |
| KR | 10-1247343 | 3/2013 |

*Primary Examiner* — Marvin Payen
(74) *Attorney, Agent, or Firm* — Lex IP Meister, PLLC (57) ABSTRACT

Disclosed is an EMI shielding method of semiconductor packages, including a tape attaching step of attaching an edge of a tape to a lower side of a frame to dispose the tape inside an inner circumferential side of the frame, a tape cutting step of forming holes through the tape at regular intervals, a semiconductor package fastening step of disposing edges of lower sides of the semiconductor packages on an upper side of the tape so that bumps, formed on the lower sides of the semiconductor packages, are inserted into the holes in the tape to thus fasten the semiconductor packages at regular intervals to the upper side of the tape, and a coating step of performing a coating operation over the tape to form a coat on the semiconductor packages and the upper side of the tape.

3 Claims, 11 Drawing Sheets

EMI SHIELDING METHOD OF SEMICONDUCTOR PACKAGES

TECHNICAL FIELD

The present invention relates to an EMI shielding method of semiconductor packages and, more particularly, to an EMI shielding method of semiconductor packages, the EMI shielding method including simultaneously coating a plurality of semiconductor packages, attached at regular intervals to the upper side of a tape, using a single coating operation, and fastening edges of lower sides of the semiconductor packages to the tape while bumps, formed on the lower sides of the semiconductor packages, are inserted into holes to thus simultaneously coat five sides, that is, sides other than the lower sides of the semiconductor packages, on which the bumps are formed, thereby reducing manufacturing costs and improving productivity.

BACKGROUND ART

Generally, highly integrated semiconductor chips capable of rapidly processing large amounts of information have been required in accordance with the reduction in the size and thickness and multi-functionalization of recent electronic equipment, and BGA semiconductor packages currently appear to meet the requirement.

The BGA semiconductor package has been developed so as to have merits in that the function and the quality are improved so as to cope with the limitation of the fine pitch surface mounting technique and high integration, damage to leads in the related art is prevented, volumes and sizes are minimized, electric functional and thermal properties are excellent, package and board assembly yields are favorable, multi-chip modules are expanded, and the cycle ranging from rapid design to production is minimized.

Further, the highly integrated BGA semiconductor package exhibits improved consistency of quality, making it easy to apply to various electronic peripherals used in various fields requiring significant reductions in size, and also has a highly competitive price, thereby providing high value.

The BGA semiconductor package has a basic constitution in which a chip-mounting unit includes circuit patterns and semiconductor chips attached to a circuit board so as to secure a large number of highly integrated circuits, the circuits of the semiconductor chips and the circuit patterns of the circuit board are bonded through wires, a package made of a compound material is formed in a package-forming unit in a region including a portion of the semiconductor chips, the wires, and the circuit patterns, and balls are fused to the metal layer of the circuit board to thus be connected to the circuits of the semiconductor chips.

Additionally, the circuit board is formed of a thin film having a small thickness, including a plane layer provided on the inside, an epoxy layer outside the plane layer, a signal layer outside the epoxy layer, and a solder mask layer outside the signal layer.

Meanwhile, EMI (electromagnetic interference) shielding of semiconductor electronic devices has recently been recommended or made compulsory by countries in order to protect users from electromagnetic waves generated from electronics in use, and the shielding constitution of electromagnetic waves using EMI shielding can be confirmed in "semiconductor package" of Korean Patent Registered No. 10-0258351.

DISCLOSURE

Technical Problem

However, known EMI shielding has drawbacks in that since compound materials fill openings formed in a shielding unit, it is difficult to apply known EMI shielding to small semiconductor packages, productivity is low, process costs are high, and the EMI shielding effect is insignificant.

Therefore, the present applicant has developed an EMI shielding method of semiconductor packages that makes it easy to realize EMI shielding of the semiconductor packages.

Technical Solution

Accordingly, the present invention has been made keeping in mind the above problems occurring in the related art, and an object of the present invention is to provide an EMI shielding method of semiconductor packages, the EMI shielding method including simultaneously coating a plurality of semiconductor packages, attached at regular intervals to the upper side of a tape, using a single coating operation, and fastening edges of lower sides of the semiconductor packages to the tape while bumps, formed on the lower sides of the semiconductor packages, are inserted into holes to thus simultaneously coat five sides, that is, sides other than the lower sides of the semiconductor packages, on which the bumps are formed, thereby reducing manufacturing costs and improving productivity.

In order to accomplish the above object, the present invention provides an EMI shielding method of semiconductor packages, including a tape attaching step of attaching the edge of a tape to the lower side of a frame to dispose the tape inside the inner circumferential side of the frame, a tape cutting step of forming holes through the tape at regular intervals, a semiconductor package fastening step of disposing edges of lower sides of the semiconductor packages on the upper side of the tape so that bumps formed on the lower sides of the semiconductor packages are inserted into the holes in the tape to thus fasten the semiconductor packages at regular intervals to the upper side of the tape, and a coating step of performing a coating operation over the tape to form a coat on the semiconductor packages, fastened to the upper side of the tape, and on the upper side of the tape. The coat is formed on five sides other than the lower sides of the semiconductor packages.

Advantageous Effects

According to an EMI shielding method of semiconductor packages of the present invention, it is possible to simultaneously coat a plurality of semiconductor packages attached at regular intervals to the upper side of a tape using a single coating operation, and to fasten the edges of lower sides of the semiconductor packages to the tape while bumps on the semiconductor packages are inserted into holes formed through the tape even though the bumps are formed on the lower sides of the semiconductor packages to thus simultaneously coat five sides, that is, sides other than the lower sides of the semiconductor packages, on which the bumps are formed, thereby reducing manufacturing costs and improving productivity.

DESCRIPTION OF THE REFERENCE NUMERALS IN THE DRAWINGS

| | |
|---|---|
| D1, D2: Area | 1: Frame |
| 10: Tape | 11: Hole |
| 20: Semiconductor package | 21: Bump |
| 30: Coat | |

BEST MODE

The constitutions of the present invention will be given below to solve the aforementioned problems.

As shown in FIGS. 1 to 11, the present invention relates to an EMI shielding method of semiconductor packages, including coating the semiconductor packages to embody EMI shielding. The EMI shielding method includes a tape attaching step of attaching the edge of a tape 10 to the lower side of a frame 1 to dispose the tape 10 inside the inner circumferential side of the frame 1 at S10, a semiconductor package fastening step of fastening semiconductor packages 20 at regular intervals to the upper side of the tape 10 at S20, and a coating step of performing a coating operation over the tape 10 to form a coat 30 on the semiconductor packages 20, fastened to the upper side of the tape 10, and on the upper side of the tape 10 at S30. The coat 30 is formed on five sides, that is, sides other than the lower sides of the semiconductor packages 20, and a detailed description will be given below.

Figure 1:
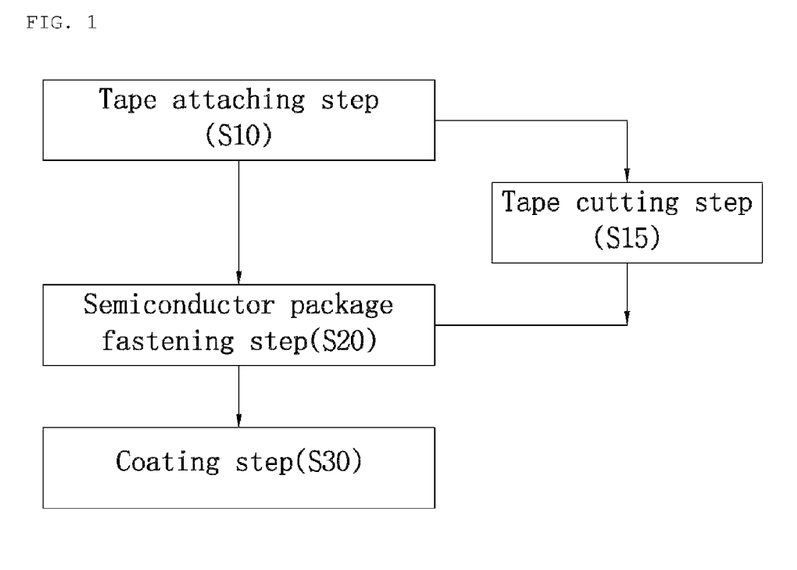
FIG. 1 is a flowchart showing an EMI shielding method of semiconductor packages of the present invention.
Figure 2:
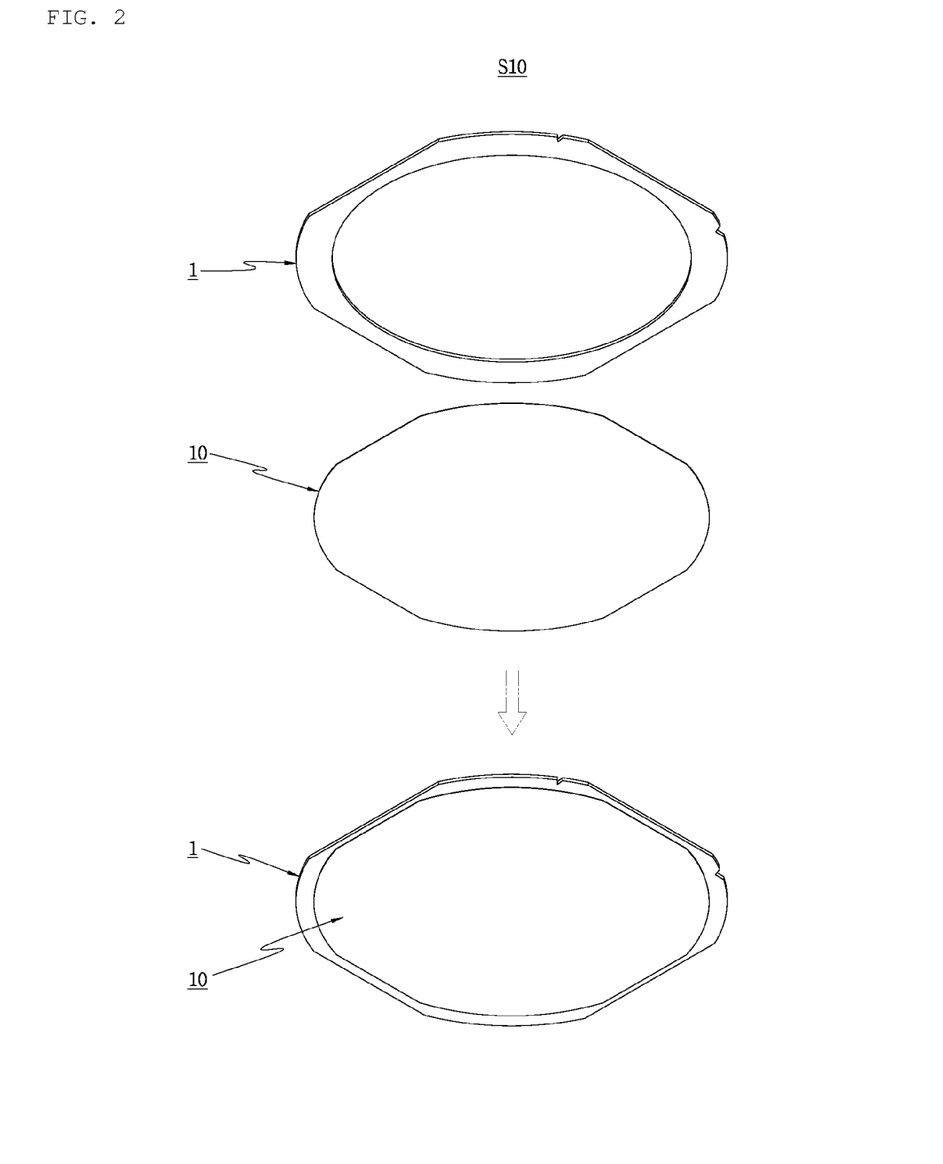
FIG. 2 is a perspective view showing a tape attaching step of the present invention.

First, as shown in FIGS. 1 and 2, the tape 10 is attached to the doughnut-type frame 1 so that the holes and the tape 10 are disposed inside the inner circumferential side of the frame 1 during the tape attaching step at S10, and the edge of the tape 10 is attached to the lower side of the frame 1 to complete the tape attaching step.

Additionally, the tape 10 may be cut in advance to correspond in size to the frame 1, and may be attached at an appropriate position. However, preferably, the tape 10 is attached to the frame 1 while covering the central portion of the frame 1, and the outermost portion of the tape 10 is cut so that the tape 10 corresponds in size to the frame 1.

Figure 3:
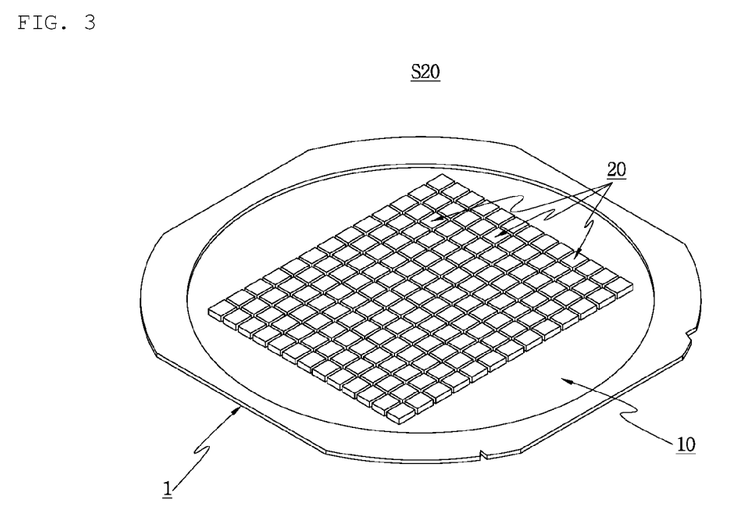
FIG. 3 is a perspective view showing a semiconductor package fastening step of the present invention.

Second, as shown in FIG. 1 or 3, the semiconductor packages 20 are situated at regular intervals on the tape 10 to fasten the lower sides of the semiconductor packages 20 to the upper side of the tape 10 during the semiconductor package fastening step at S20. It is preferable that the semiconductor packages 20 be automatically disposed at regular intervals using a typical transporting device (not shown) such as a known picker.

Third, as shown in FIGS. 1 or 4 to 6, the coat 30 is formed on the semiconductor packages 20 fastened to the upper side of the tape 10 during the coating step at S30. The coating operation is performed over the tape 10.

Figure 4:
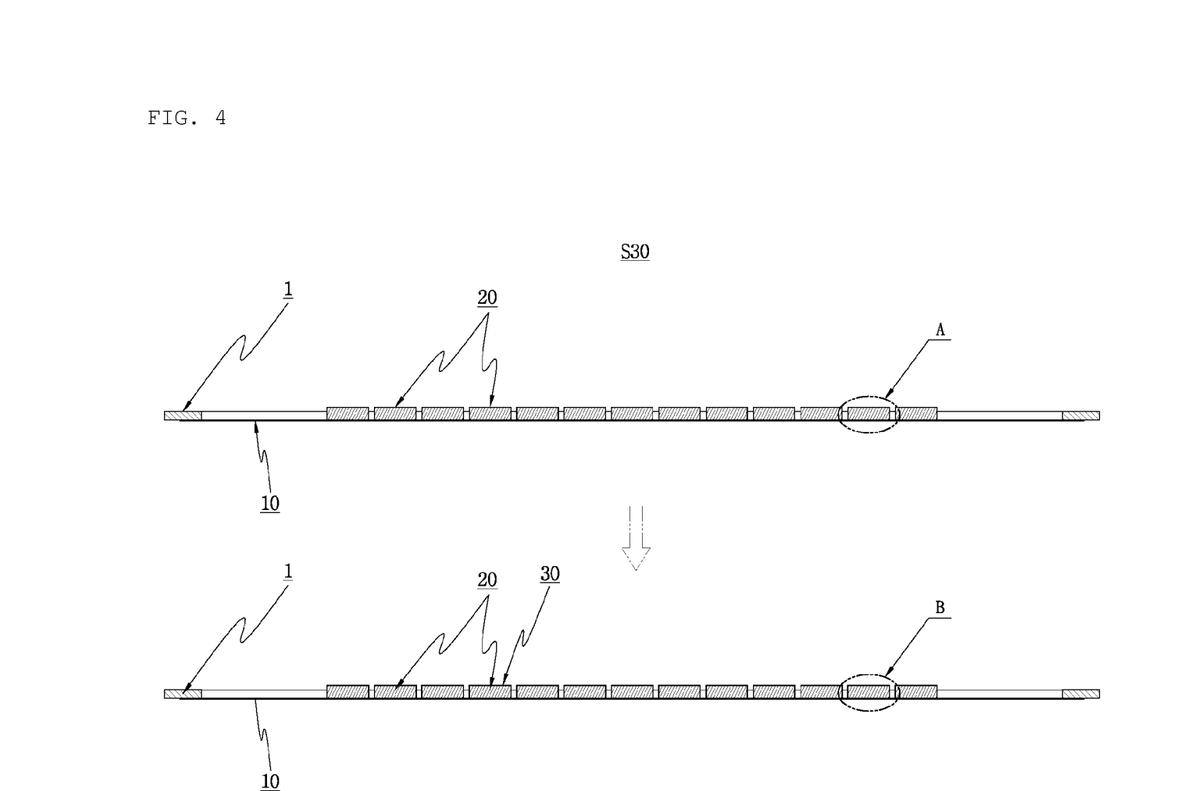
FIG. 4 is a sectional view showing a coating step of the present invention.
Figure 5:
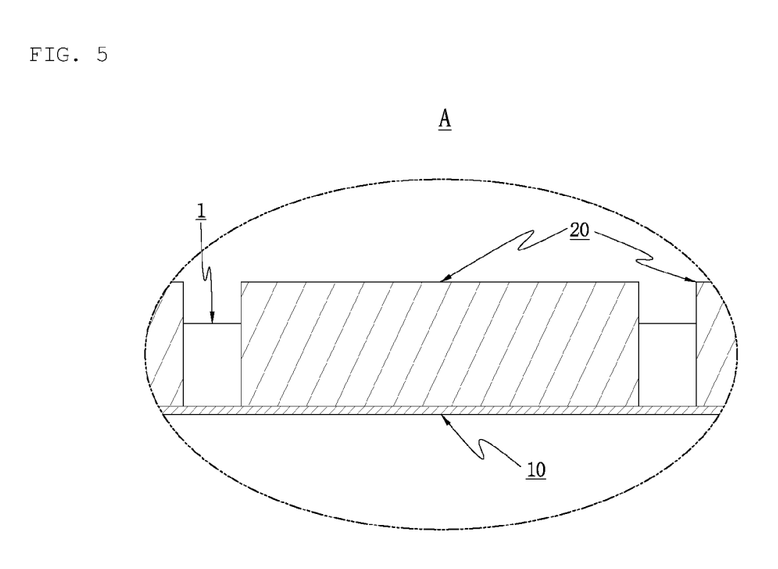
FIG. 5 is an enlarged view of portion A of FIG. 4.
Figure 6:
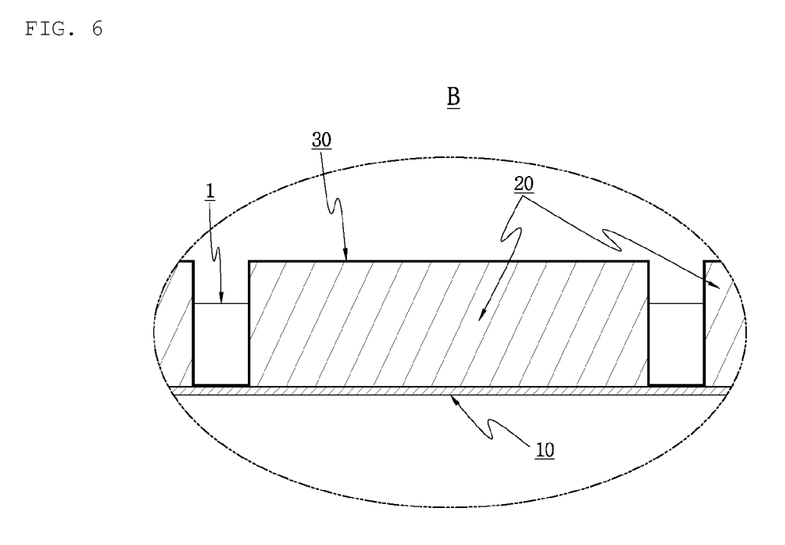
FIG. 6 is an enlarged view of portion B of FIG. 4.

Therefore, the coat 30 may be formed on five sides, namely the front, rear, left, right, and upper sides, of each of the semiconductor packages 20 in addition to the upper side of the tape 10, and may also be formed on a portion of the frame 1 or the entire frame 1 during the coating step at S30. That is, all sides other than the lower side of each of the semiconductor packages 20, which are fastened to the tape 10, may be coated.

Moreover, it is preferable that the coat 30 be formed using typical deposition such as vacuum deposition during the coating step at S30, but various processes such as dipping or plating, including electroless plating, may be used.

Additionally, the coat 30 may be formed on all sides using a single coating operation during coating of the present invention to make it easy to manufacture the EMI-shielded semiconductor packages 20, thereby reducing manufacturing costs and improving productivity.

Meanwhile, the semiconductor packages 20 including the bumps 21 on the lower side thereof may be coated in the present invention. For this, as shown in FIG. 1 or 7, the tape cutting step of forming the holes 11, into which the bumps 21 are inserted, through the tape 10 at regular intervals at S15 needs to be further included between the tape attaching step at S10 and the semiconductor package fastening step at S20.

Figure 8:
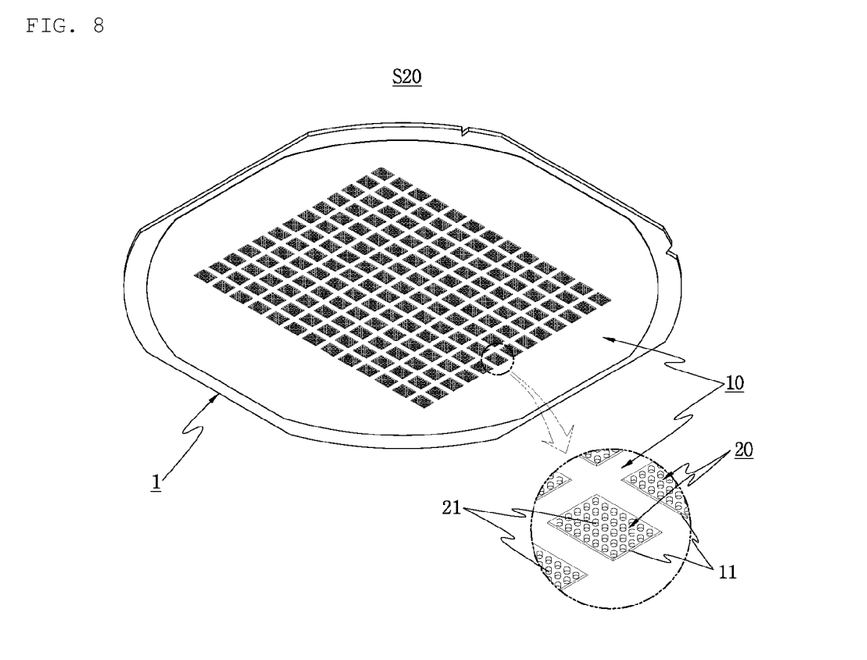
FIG. 8 is a perspective view showing, from the underside, the semiconductor package fastening step of fastening the semiconductor packages having bumps to a tape having holes according to the present invention.

Additionally, as shown in FIG. 8, it is preferable to automatically dispose the edges of the lower sides of the semiconductor packages 20 on the upper side of the tape 10 so that the bumps 21 are inserted into the holes 11 in the tape 10 using a typical transporting device (not shown), such as a known picker, during the semiconductor package fastening step at S20. When the semiconductor packages 20 are disposed at predetermined positions, the edges of the semiconductor packages 20, which come into close contact with the tape 10, are fastened to the tape 10 due to the characteristic fastening structure of the upper side of the tape 10.

Figure 9:
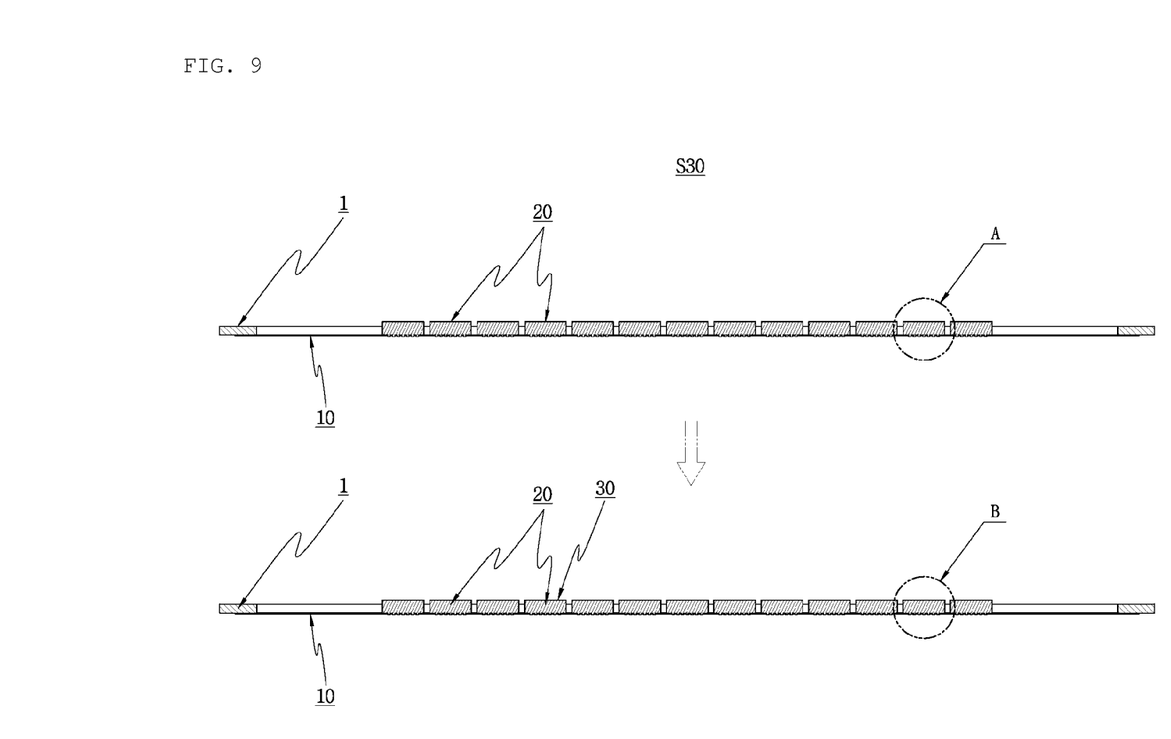
FIG. 9 is a sectional view showing the coating step of coating the semiconductor packages having the bumps according to the present invention.
Figure 10:
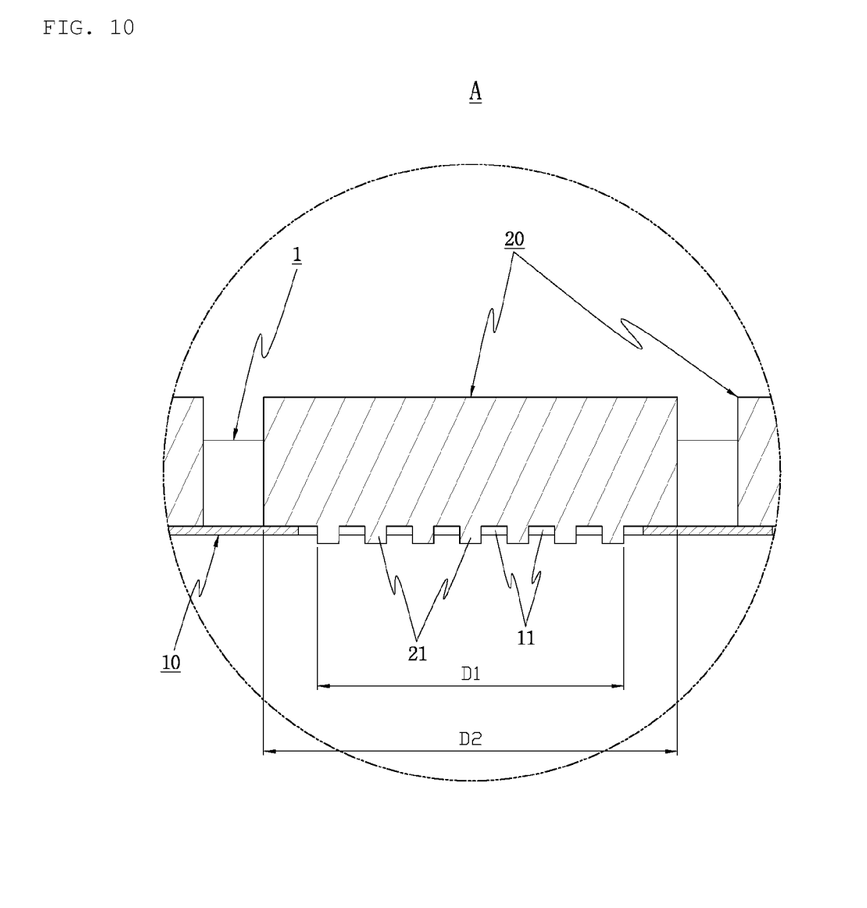
FIG. 10 is an enlarged view of portion A of FIG. 9.
Figure 11:
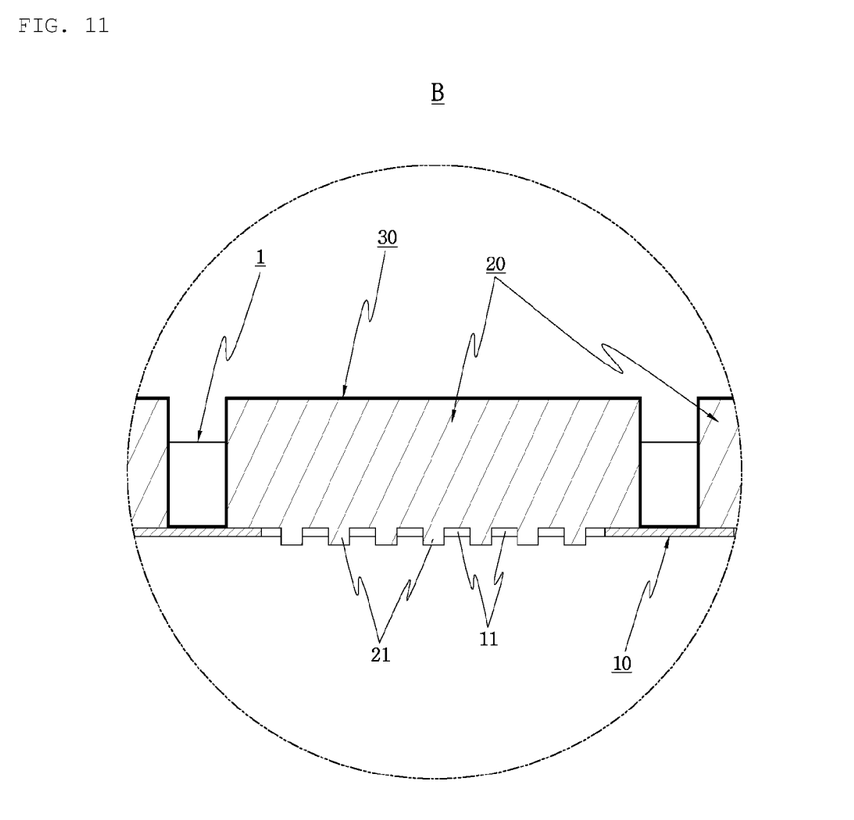
FIG. 11 is an enlarged view of portion B of FIG. 9.

Therefore, as shown in FIGS. 9 to 11, the coating operation is performed over the tape 10 to form the coat 30 on five sides, namely the front, rear, left, right, and upper sides, of each of the semiconductor packages 20 in addition to the upper side of the tape 10, and accordingly, the five sides, that is, sides other than the lower side of each of the semiconductor packages 20, on which the bumps 21 are formed, are coated.

Figure 7:
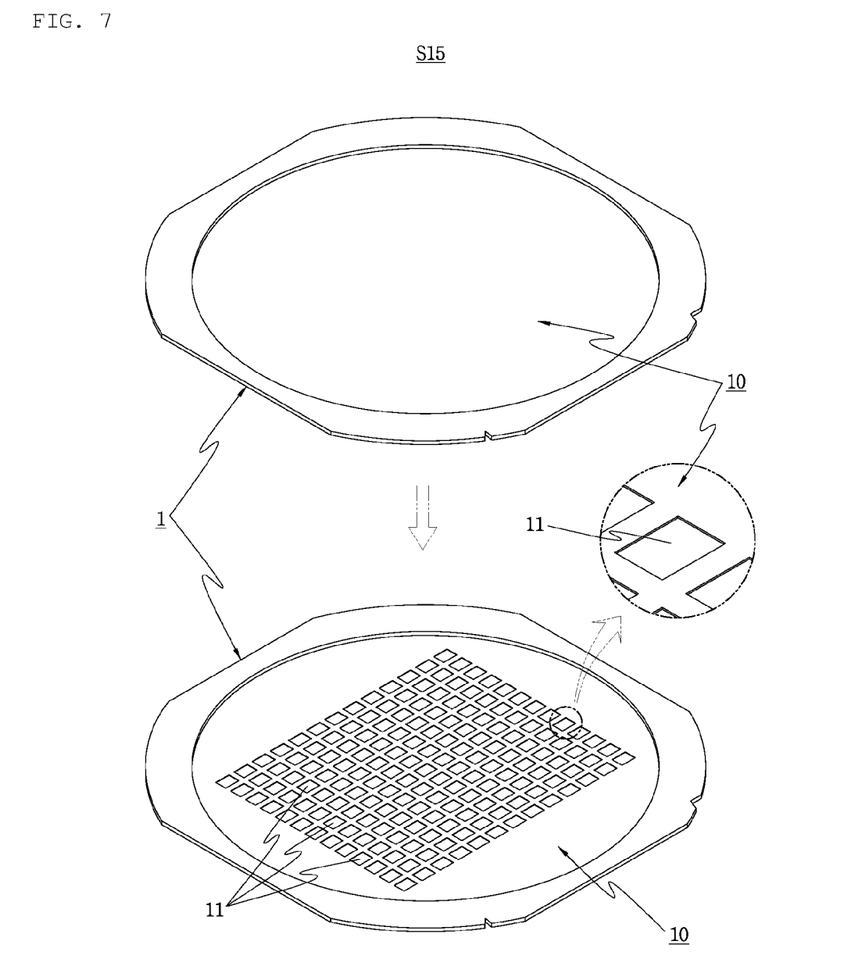
FIG. 7 is a perspective view showing a tape cutting step of the present invention.

Further, as shown in FIG. 1 or 7, the holes 11 are formed to insert the bumps 21, which protrude downward from the semiconductor packages 20, thereinto during the tape cutting step 15. The holes 11 are formed to be spaced apart from each other at regular intervals in order to make it easy to fasten the semiconductor packages 20, which are transported and disposed at regular intervals using a transporting device (not shown) such as a known picker. The holes 11 may be variously formed depending on the size or the shape of the semiconductor package 20.

Moreover, it is preferable that laser cutting be used in order to easily and precisely form the holes 11, but the holes 11 may be formed during punching processing using a mold.

Additionally, as shown in FIG. 10, the size of each of the holes 11 needs to be larger than the distribution area D1 in which each of the bumps 21 is formed on the lower side of each of the semiconductor packages 20 and smaller than the area D2 of each of the semiconductor packages 20 so that the edges of the lower sides of the semiconductor packages 20 are fastened to the upper side of the tape 10.

Additionally, instead of the bumps 21, balls (not shown) may be attached to the lower sides of the semiconductor packages 20. The aforementioned procedure may be applied even when the balls are formed on the lower sides of the semiconductor packages 20, and accordingly, the bumps 21 described in the present invention mean all constitutions which protrude downward from the semiconductor packages 20.

INDUSTRIAL APPLICABILITY

As described above, according to an EMI shielding method of semiconductor packages of the present invention, it is possible to simultaneously coat five sides, namely the front, rear, left, right, and upper sides, other than lower sides of semiconductor packages 20, and to coat all of the semiconductor packages 20 fastened to the upper side of a tape 10 using a single coating operation, thereby reducing manufacturing costs and improving productivity.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. An EMI shielding method of semiconductor packages, comprising:
    a tape attaching step (S10) of attaching an edge of a tape (10) to a lower side of a frame (1) to dispose the tape (10) inside an inner circumferential side of the frame (1);
    a tape cutting step (S15) of forming holes (11) through the tape (10) at regular intervals;
    a semiconductor package fastening step (S20) of disposing edges of lower sides of semiconductor packages (20) on an upper side of the tape (10) so that bumps (21) formed on the lower sides of the semiconductor packages (20) are inserted into the holes (11) in the tape (10) to thus fasten the semiconductor packages (20) at regular intervals to the upper side of the tape (10); and
    a coating step (S30) of performing a coating operation over the tape (10) to form a coat (30) on the semiconductor packages (20), fastened to the upper side of the tape (10), and the upper side of the tape (10),
    wherein the coat (30) is formed on five sides other than the lower sides of the semiconductor packages (20).

2. The EMI shielding method of claim 1, wherein the holes (11) are formed using laser cutting or punching processing during the tape cutting step (S15), and a size of each of the holes (11) is larger than a distribution area (D1) in which each of the bumps (21) is formed and smaller than an area (D2) of each of the semiconductor packages (20).

3. The EMI shielding method of claim 1, wherein the coat (30) is formed using vacuum deposition or electroless plating during the coating step (S30).

* * * * *